(12) United States Patent
Wong et al.

(10) Patent No.: US 7,915,691 B2
(45) Date of Patent: Mar. 29, 2011

(54) HIGH DENSITY SRAM CELL WITH HYBRID DEVICES

(75) Inventors: Robert C. Wong, Poughkeepsie, NY (US); Haining Sam Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 760 days.

(21) Appl. No.: 11/928,418

(22) Filed: Oct. 30, 2007

(65) Prior Publication Data

US 2009/0108374 A1 Apr. 30, 2009

(51) Int. Cl.
*H01L 27/088* (2006.01)
(52) U.S. Cl. .................. 257/392; 438/217
(58) Field of Classification Search .................. 257/392; 438/217
See application file for complete search history.

(56) References Cited

U.S. PATENT DOCUMENTS

| | | |
|---|---|---|
| 6,765,303 B1 | 7/2004 | Krivokapic et al. |
| 6,867,460 B1 | 3/2005 | Anderson et al. |
| 6,924,560 B2 | 8/2005 | Wang et al. |
| 6,977,837 B2 | 12/2005 | Watanabe et al. |
| 7,087,477 B2 | 8/2006 | Fried et al. |
| 2003/0102518 A1 | 6/2003 | Fried et al. |
| 2005/0029556 A1 | 2/2005 | Wang et al. |
| 2006/0175669 A1 | 8/2006 | Kim et al. |
| 2006/0183289 A1 | 8/2006 | Anderson et al. |
| 2006/0214233 A1 | 9/2006 | Ananthanarayanan et al. |
| 2006/0227595 A1 | 10/2006 | Chuang et al. |

*Primary Examiner* — Douglas M Menz
(74) *Attorney, Agent, or Firm* — Schmeiser, Olsen & Watts; Ian D. MacKinnon

(57) ABSTRACT

Hybrid SRAM circuit, hybrid SRAM structures and method of fabricating hybrid SRAMs. The SRAM structures include first and second cross-coupled inverters coupled to first and second pass gate devices. The pull-down devices of the inverters are FinFETs while the pull-up devices of the inverters and the pass gate devices are planar FETs or pull-down and pull-up devices of the inverters are FinFETs while the pass gate devices are planar FETs.

20 Claims, 10 Drawing Sheets

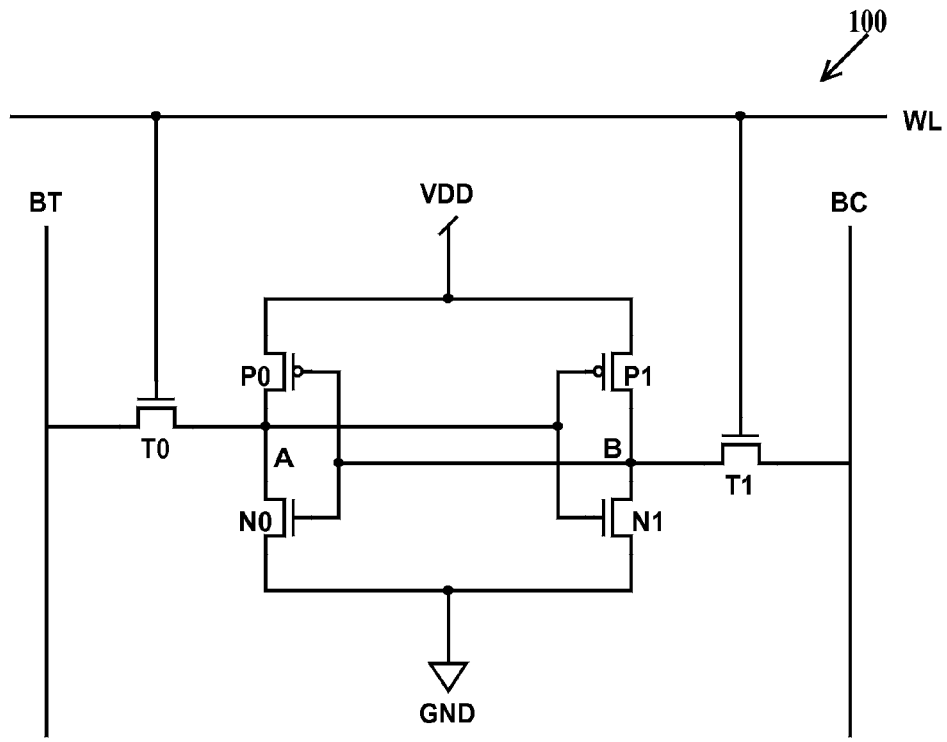
*FIG. 1A*
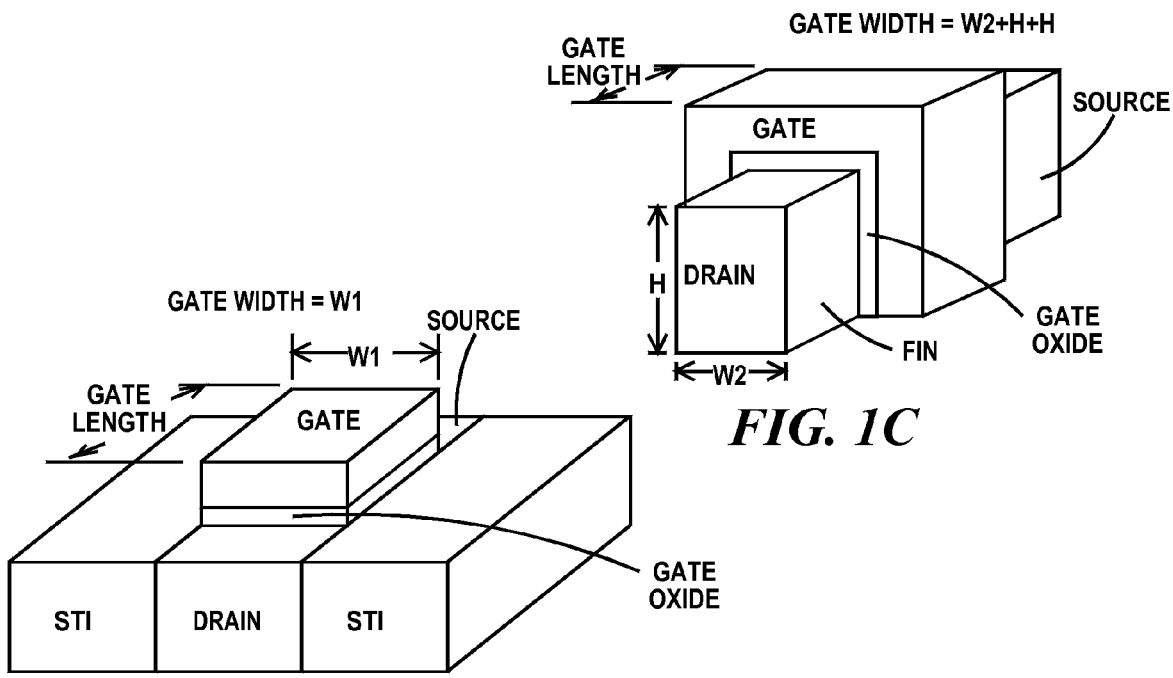
*FIG. 1C*
*FIG. 1B*

HIGH DENSITY SRAM CELL WITH HYBRID DEVICES

FIELD OF THE INVENTION

The present invention relates to the field of integrated circuits; more specifically, it relates to SRAM circuits, physical designs of SRAM circuits and methods of fabricating SRAM circuits.

BACKGROUND OF THE INVENTION

In many advanced integrated circuit chips (e.g., microprocessors) about 50% of the chip area is occupied by embedded static random access memory (SRAM). It is expected that this may reach as high as about 70% in the future. Since chip area is a significant cost factor in the fabrication of integrated circuits, the industry is always looking to ways to reduce integrated circuit area and an SRAM that uses less chip area would be welcomed. Therefore, there is an ongoing need to reduce the chip area required by SRAM circuits.

SUMMARY OF THE INVENTION

A first aspect of the present invention is a circuit, comprising: a first inverter comprising a first PFET and a first NFET, a source of the first PFET coupled to a first terminal of a power supply, a source of the first NFET coupled to a second terminal of the power supply, drains of the first PFET and the first NFET connected to a first storage node, gates of the first PFET and the first NFET connected to a second storage node, the first NFET being a FinFET; a second inverter comprising a second PFET and a second NFET, a source of the second PFET coupled to the first terminal of the power supply, a source of the second NFET coupled to the second terminal of the power supply, drains of the second PFET and the second NFET connected to the second storage node, gates of the second PFET and second NFET connected to the first storage node, the second NFET being a FinFET; a first FET connected between the first storage node and a first bitline, a gate of the first FET connected to a wordline, the first FET being a planar FET; and a second FET connected between the second storage node and a second bitline, a gate of the second FET connected to the wordline, the second FET being a planar FET.

A second aspect of the present invention is a structure, comprising: a rectangular first region of a semiconductor layer having first and second opposite ends connected by first and second opposite sidewalls, a source of a first NFET abutting the first end of the first region, a source of a second NFET abutting the second end of the first region, a first common drain region of the first and second NFETs between the first and second ends of the first region, a channel region of the first NFET between the source of the first NFET and the first common drain region, a channel region of the second NFET between the source of the second NFET and the first common drain region, a first gate dielectric layer between the top surface of the channel region of the first NFET and a first gate electrode, the first dielectric layer not extending over the first and second sidewalls of the first region in the channel region of the first NFET, a second gate dielectric layer between (i) a top surface and the first and second sidewalls of the first region in the channel region of the second NFET and (ii) a second gate electrode; and a second region of the semiconductor layer having first and second opposite ends connected by first and second opposite sidewalls, a drain of a first PFET abutting the first end of the second region, a source of the first PFET abutting the second end of the second region, a channel region of the first PFET between the source and the drain of the first PFET, a third dielectric layer between the second gate electrode and a top surface of the channel region of the first PFET.

A third aspect of the present invention is a method, comprising: (a) forming a pad layer on a top surface of a semiconductor layer; after (a), (b) removing regions of the pad layer to form a patterned pad layer; after (b), (c) forming trenches in the substrate where the substrate is not protected by the patterned pad layer; after (c), (d) filling the trenches with a dielectric material to form rectangular first, second, third and fourth regions of the semiconductor layer, each of the first, second, third and fourth regions having respective opposite first and second ends and opposite first and second sidewalls connecting the first and second ends; after (d), (e) recessing a first area of the dielectric isolation abutting regions of the first and second sidewalls proximate to the second end of the first region below a top surface of the dielectric isolation, recessing a second area of the dielectric isolation abutting regions of the first and second sidewalls proximate to the second end of the third region below the top surface of the dielectric isolation, the first and second areas of the dielectric isolation coplanar; after (e), (f) removing any remaining portions of the pad layer and forming a gate dielectric layer on all exposed surfaces of the semiconductor substrate; after (f), (g) forming a polysilicon layer on the gate dielectric layer and all exposed surfaces of the dielectric isolation; after (g), (h) patterning the polysilicon layer to form a first gate electrode extending over the first region, a second gate electrode extending over the first and second regions, a third gate electrode extending over the third region, a fourth gate electrode extending over the third and fourth regions; after (h), (i) ion implanting an N-type first dopant species into the first and third regions to form a source of a first NFET abutting the first end of the first region, a source of a second NFET abutting the second end of the first region, a first common drain region of the first and second NFETs between the first and second gate electrodes, a source of a third NFET abutting the first end of the third region, a source of a fourth NFET abutting the second end of the third region, a second common drain region of the third and fourth NFETs between the third and fourth gate electrodes; and after (i), (j) ion implanting a P-type second dopant species into the second and fourth regions to form, a drain of a first PFET abutting the first end of the second region, a source of the first PFET abutting the second end of the second region, a channel region of the first PFET between the source and the drain of the first PFET and under the second gate electrode, a drain of a second PFET abutting the first end of the fourth region, a source of the second PFET abutting the second end of the fourth region, a channel region of the second PFET between the source and the drain of the second PFET and under the fourth gate electrode.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

FIG. 1A is circuit diagram of an exemplary a static random access memory cell;

FIG. 1B is a top view of an exemplary planar field effect transistor;

FIG. 1C is an isometric view of an exemplary FinFET;

DETAILED DESCRIPTION OF THE INVENTION

Figure 2:
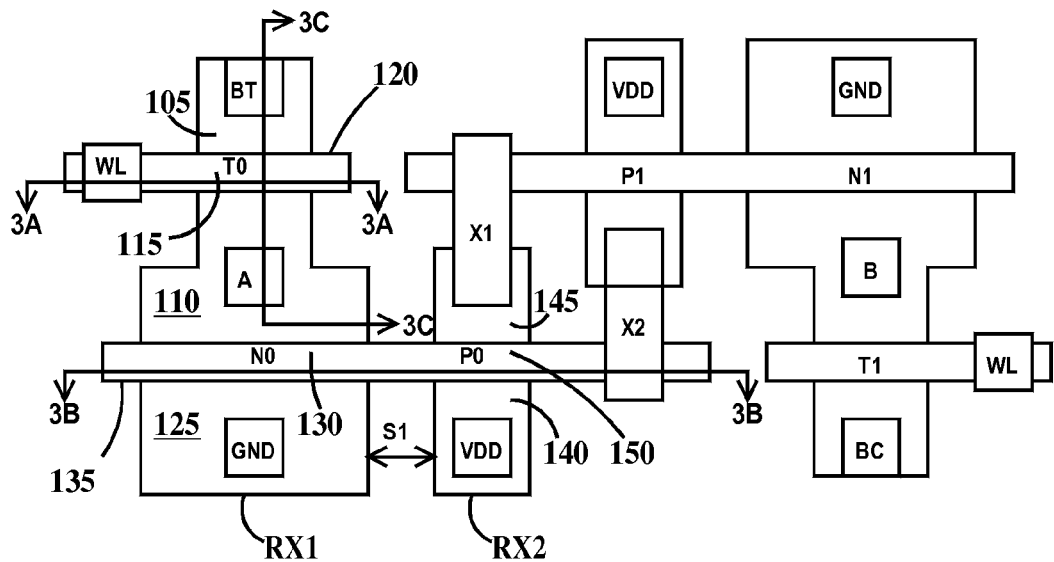
FIG. 2 is a top view and FIGS. 3A, 3B and 3C are section views through respective lines 3A-3A, 3B-3B and 3C-3C of FIG. 2 of an exemplary prior art SRAM cell.

FIG. 1A is circuit diagram of an exemplary a static random access memory cell. In FIG. 1A, a static random access memory (SRAM) cell 100 comprises pass gate field effect transistors (FETs) T0 and T1 (which are illustrated as n-channel FETs (NFETs), NFETs N0 and N1 and p-channel FETs (PFETs) P0 and P1. The sources of PFETs P0 and P1 are connected to VDD and the drains of PFETs P0 and P1 to nodes A and B respectively. The sources of NFETs N0 and N1 are connected to GND and the drains of NFETs N0 and N1 to nodes A and B respectively. VDD and GND may be considered two terminals of a power supply. The gates of PFET P0 and NFET N0 are connected to node B and the gates of PFET P1 and NFET N1 are connected to node A. The drain of NFET T0 is connected to node A, the source of NFET T0 is connected to a bitline true (BT) line and the gate of NFET T0 is connected to a wordline WL. PFET P0 and NFET N0 form a first inverter and PFET P1 and NFET N1 form a second inverter. PFETS P0 and P1 are pull-up devices and NFETs N0 and N1 are pull-down devices in that they pull up nodes A and B to VDD or pull down nodes A and be to GND. The first and second inverters are cross-coupled. The drain of NFET T1 is connected to node B, the source of NFET T1 is connected to a bitline complement (BC) line and the gate of NFET T1 is connected to wordline WL. Alternatively pass gate FETs T0 and T1 may be PFETs.

In FIG. 1A, PFETs P0 and P1 are called pull-up devices and NFETs N0 and N1 are called pull-down devices. In a first embodiment of the present invention, NFETs N0 and N1 are FinFETs and PFETs P0 and P1 and FETs T0 and T1 are planar FETs. In a second embodiment of the present invention, NFET N0, NFET N1, PFET P0 and PFET P1 are FinFETs and FETs T0 and T1 are planar FETs.

In order for SRAM cell 100 to be stable, pull down devices (e.g., NFETs N0 and N1) should have the highest current drive, which mean they should have a widest gate width (see description of gate widths and lengths infra), pull-up devices (e.g., PFETs P0 and P1) have the narrowest gate widths and pass gates (e.g., FETs T0 and T1) a gate width between that of the pull-up and pull-down devices. In one example, NFETs N0 and N1 have a gate width of about 200 nm. FETs T0 and T1 have gate widths of about 100 nm and PFETs P0 and P1 have gate widths of about 50 nm. It is this need for wide pull-down FETs relative to the widths of the other FETs that results in a significant amount of chip area being taken up by the pull-down FETs.

FIG. 1B is an isometric view of an exemplary planar field effect transistor. A planar FET is defined as an FET where the source/drains are formed on either side of and abutting a channel region of the planar FET formed in a semiconductor layer of a substrate. Top surfaces of the source/drains and channel region are in about the same plane. A gate dielectric is formed on the top surface of the channel region and a gate electrode is formed on the gate dielectric over the channel region. A planar FET requires the gate dielectric and gate electrode be formed on surfaces that are parallel to a top surface of a substrate in/on which the planar FET is fabricated. In FIG. 1B, gate length is defined as the physical dimension of the gate electrode measured in a first direction between the source and drain and gate width is defined as the physical dimension of the gate electrode over the channel region measured in a second direction perpendicular to the first direction. In FIG. 1B, the gate width is W1. Shallow trench isolation (STI) surrounds the planar FET.

FIG. 1C is an isometric view of an exemplary FinFET. A FinFET is defined as a an FET formed in a block (i.e., fin) of semiconductor material having opposite ends, a top surface and opposite first and second sidewalls, where the source and drain are formed adjacent to the ends of the block with the channel region between and abutting the source and drain. A gate dielectric is formed on at least two of the first sidewall of the block, the second sidewall of the block and the top surface of the block over the channel region. A gate electrode is formed on the gate dielectric over at least two of the first sidewall, second sidewall and top surface of the block. A FinFET requires the gate dielectric and gate electrode be formed on at least two different surfaces of the block, at least one of the surfaces being perpendicular to a top surface of a substrate in/on which the FinFET is fabricated In FIG. 1C, gate length is defined as the physical dimension of the gate electrode measured in a first direction between the source and drain and gate width is defined as the physical dimension of the gate electrode over the sidewalls and top surface of channel region of the block measured in one or two directions perpendicular to the first direction. In FIG. 1C, the fin has height H and width W2 and the gate width is about equal to W2+H+H.

Hereinafter, various layouts and cross-sections of physical implementations of SRAM circuit 100 of FIG. 1A are illustrated and described. Pass gate FETs T0 and T1 are illustrated as NFETs. Generally FET T0, NFET N0 and PFET P0 are described in detail, but the descriptions of FET T1, NFET N1 and PFET P1 would be similar because the DRAM circuit of FIG. 1A is symmetrical.

Figure 3A:
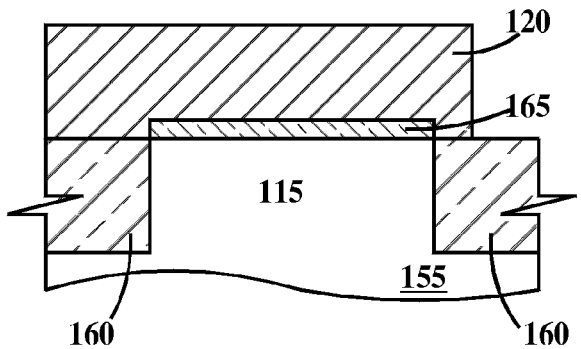
Figure 3C:
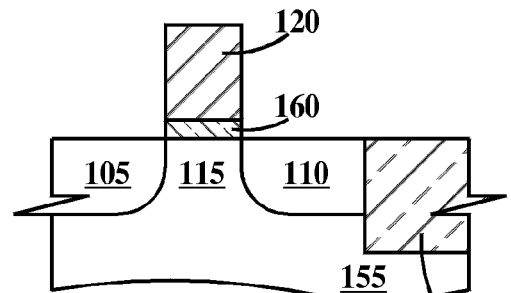
Figure 3B:
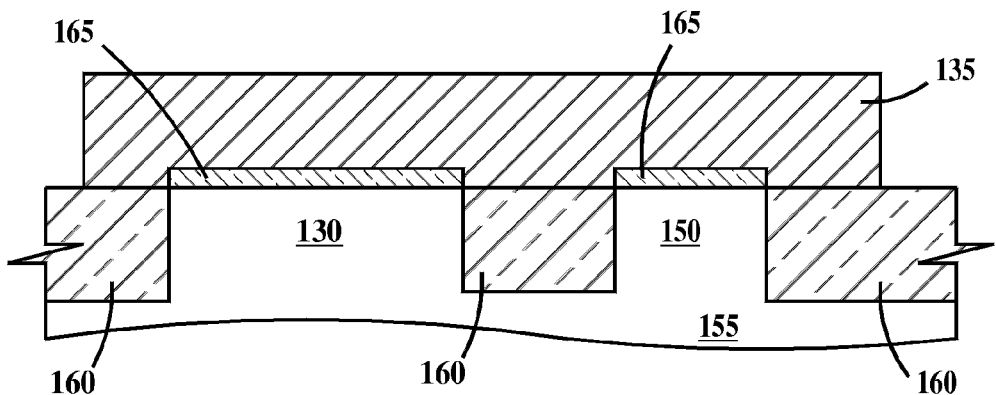

FIG. 2 is a top view and FIGS. 3A, 3B and 3C are section views through respective lines 3A-3A, 3B-3B and 3C-3C of FIG. 2 of an exemplary prior art SRAM cell. In FIGS. 2, 3A, 3B and 3C, NFETS N0 and N1, PFETs P0 and P1 and FET T0 and T1 are planar FETS as illustrated in FIG. 1B and described supra. In FIG. 2, pass gate FETs T0 includes a source 105, a drain 110 and a channel region 115 between source 105 and drain 110 under a polysilicon gate electrode 120. Pull-down NFET N0 includes drain 110, a source 125 and a channel region 130 between drain 110 and source 125 under a polysilicon gate electrode 135. Sources 105 and 125, drain 110 and channel regions 115 and 130 are formed in a P-well RX1. Pull-up PFET P0 includes a source 140, a drain 145 and a channel region 150 between source region 140 and drain 145 and under gate electrode 135. Source 140, drain 145 and channel region 150 are formed in an N-well RX2. Drain 110 is common to both FET T0 and NFET N0. Gate electrode 135 is common to NFET N0 and PFET P0. PFET P1, NFET N1 and FET T1 are diagonal mirror images of PFET P0, NFET N0 and FET T0.

A WL contact is formed to gate electrode 120, a BT contact is formed to source 105, an A node contact is formed to drain 110, a GND contact is formed to source 125 and a VDD contact is formed to source 140. A WL contact is formed to the gate of FET T1, a BT contact is formed to the source of FET T0, a B node contact is formed to drain of FET T1, a GND contact is formed to the source of NFET N1 and a VDD contact is formed to source of PFET P1. A Contact X1 electrically connects drain 145 of PFET P0 to the gate of PFET P1 and NFET N1. A contact X2 electrically connects the drain of PFET P1 to gate electrode 135 of PFET P0 and NFET N0.

In FIG. 2, the ratio of gate widths of NFET N0 (or N1) to FET T0 (or T1) to PFET P0 (or P1) is about 4 to 2 to 1. In other examples the gate width of NFET N0 (or N1) is greater than the gate width of PFET T0 (or T1) and the gate width of FET T0 (or T1). In one example, the gate width of NFET N0 (or N1) is greater than the gate width of PFET T0 (or T1) and the gate width of FET T0 (or T1) is about as the gate width of PFET T0 (T1). In FIG. 2, P-well RX1 is spaced a distance S1 from N-well RX2. While it is advantageous for S1 to be as small as possible to reduce the overall area of the SRAM cell, it is also advantageous to increase S1 so as to reduce threshold voltage shifts in NFET N0 (N1) and PFET P0 (P1) due to dopant diffusion through gate electrode 135.

In FIGS. 3A, 3B and 3C, contacts WL, BT, node A and X2 are not shown. In FIGS. 3A, 3B, and 3C, it can be seen that P-well RX1 containing channel regions 115 and 130 and N-well RX2 containing 150 are formed in a semiconductor substrate 155 and isolated by dielectric filled STI 160. A gate dielectric layer 165 electrically insulate gates 120 and 135 from channel regions 115, 130 and 150.

Figure 4:
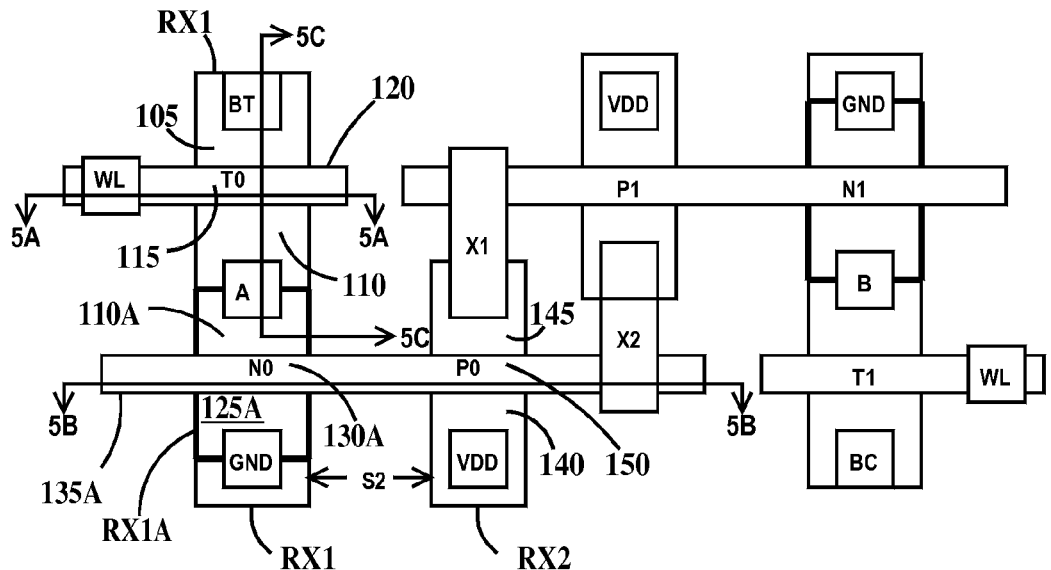
FIG. 4 is a top view and FIGS. 5A, 5B and 5C are section views through respective lines 5A-5A, 5B-5B and 5C-5C of FIG. 4 of an SRAM cell according to a first embodiment of the present invention.
Figure 5A:
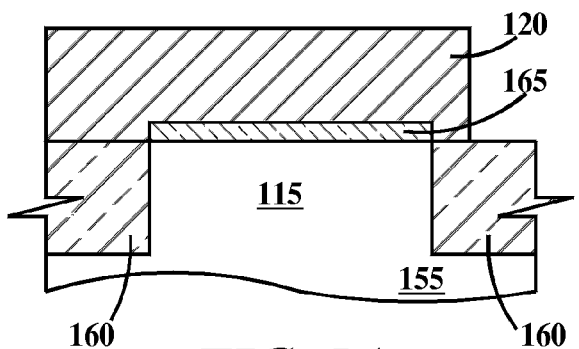
Figure 5C:
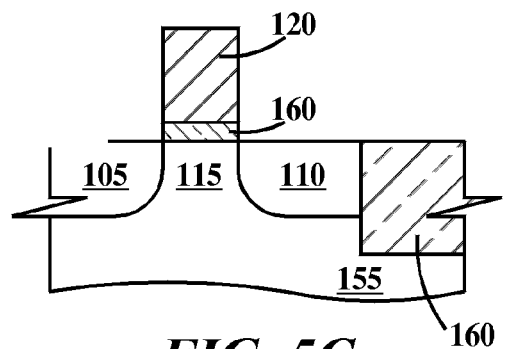
Figure 5B:
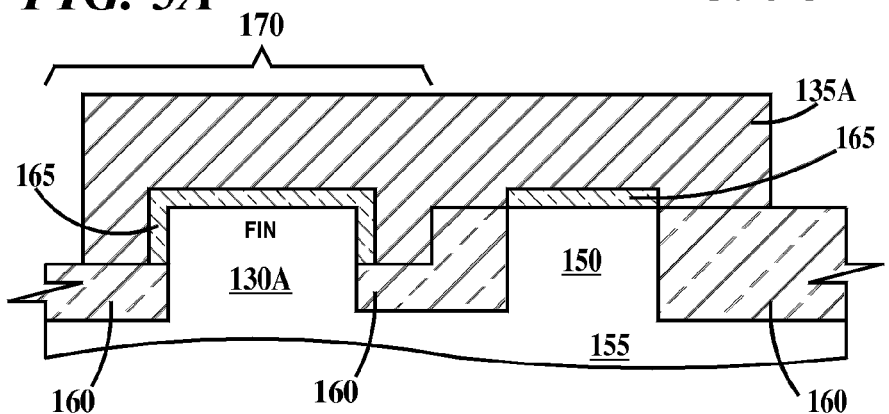

FIG. 4 is a top view and FIGS. 5A, 5B and 5C are section views through respective lines 5A-5A, 5B-5B and 5C-5C of FIG. 4 of an SRAM cell according to a first embodiment of the present invention. FIG. 4 is similar to FIG. 2, except a portion of P-well RX1 of FIG. 2 under FET T0 is replaced with a P-type semiconductor fin RX1A (heavy lines). NFET T0 now comprises a drain 110A, a source 125A, a channel region 130A and a gate electrode 135A. Drain 110 is contiguous drain 110A and P-well RX1 is contiguous with fin RX1A. A portion of Source 125A is formed in fin RX1A and a portion of source 125A is formed in P-well RX1. Alternatively, fin RX1A may include all of source 125A. Another advantage of the SRAM cell layout of FIG. 4, is all photomask shapes used to fabricate the SRAM cell of FIG. 4, at the fabrication levels illustrated, are advantageously square or rectangular. There are no inside corners or "T" shapes mask shapes. This improves photolithography printability and critical dimension control.

In FIGS. 5A, 5B and 5C, contacts WL, BT, node A and X2 are not shown. As can be seen from FIG. 4 and FIG. 5B, the fin containing a drain 110A, a source 125A and a channel region 130A is actually formed by removing a portion of STI 160 in a region 170 adjacent to drain 110A, source 125A and channel region 130A of NFET N0 (also NFET N1). In FIG. 5B, gate dielectric layer 165 is formed on the sidewalls as well as a top surface of channel region 130A. FETs T0 and T1 and PFETs P0 and P1 are planar FETs and NFETs N0 and N1 are FinFETs. Thus the width of fin RX1A measured along line 5B-5B of FIG. 4 over channel region 130A can be reduced compared to the width of P-well RX1 measured along line 3B-3B of FIG. 2, the gate width of gate electrode 135A of NFET N0 (and N1) can be the same as the gate width of gate electrode 130 of NFET N0 (and N1) of FIG. 2 because gate electrode 135A and gate dielectric layer 165 wrap over the sidewalls of fin RX1A. This allows the distance S2 between fin RX1A and N-well RX2 to be greater than the distance S1 of FIG. 2 while still reducing (by up to about 18%) the overall area of the SRAM cell of FIG. 4 compared to the SRAM cell of FIG. 2.

In the SRAM cell of FIG. 4, a ratio of drive current capability of NFET N0 to a drive current capability of said FET T0 is greater than N, a ratio of drive current capability of said NFET N1 to a drive current capability of FET T0 is greater than N. In one example, N is equal to or greater than about 1.0. In one example, N is between about 1.7 and about 2.2.

Figure 6:
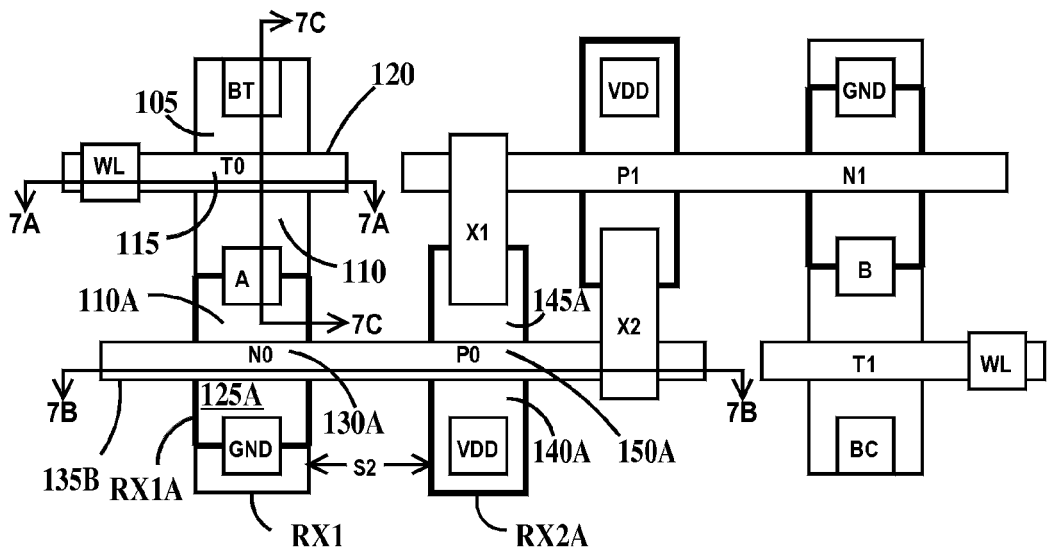
FIG. 6 is a top view and FIGS. 7A, 7B and 7C are section views through respective lines 7A-7A, 7B-7B and 7C-7C of FIG. 6 of an SRAM cell according to a second embodiment of the present invention.
Figure 7A:
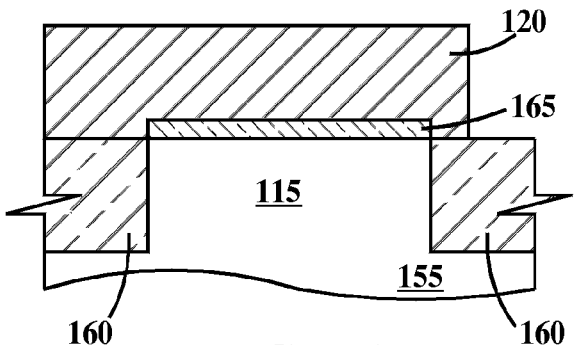
Figure 7C:
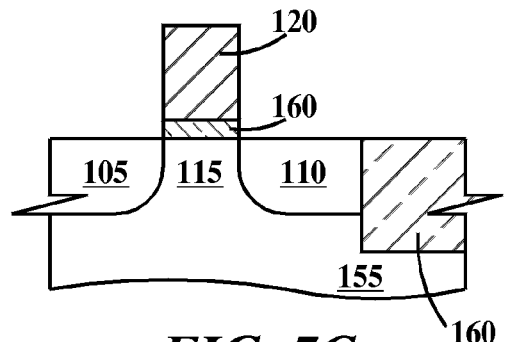
Figure 7B:
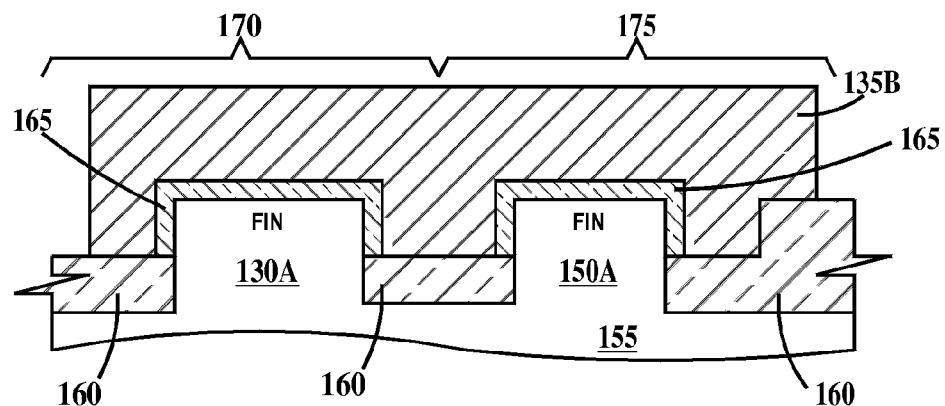

FIG. 6 is a top view and FIGS. 7A, 7B and 7C are section views through respective lines 7A-7A, 7B-7B and 7C-7C of FIG. 6 of an SRAM cell according to a second embodiment of the present invention. FIG. 6 is similar to FIG. 4, except the entire N-well RX2 of FIG. 4 is replaced with an N-type semiconductor fin RX2A (heavy lines) and PFET N0 comprises a drain 145A, a source 145A, a channel region 150A and a gate electrode 135B. In FIGS. 7A, 7B and 7C, contacts WL, BT, node A and X2 are not shown. As can be seen from FIGS. 6 and 7B, the fin containing a source region 140A, a drain region 145A and a channel regions 150A is actually formed by removing a portion of STI 160 in a region 175 adjacent to source 140A, drain 145A and channel region 150A. In FIG. 7B, gate dielectric layer 165 is formed on the sidewalls as well as a top surface of channel region 150A. FETs T0 and T1 are planar FETs and NFETs N0 and N1 and PFETs P0 and P1 are FinFETs. Because the gate width of gate electrode 150A of PFET P0 (and P1) are increased compared to the gate width of gate electrode 150 of NFET P0 (and P1) of FIG. 4 because the gate electrode and gate dielectric layer 165 wrap over the sidewall of the fin, the write margin of the SRAM cell of FIG. 6 is improved without any increase in cell area.

Figure 8:
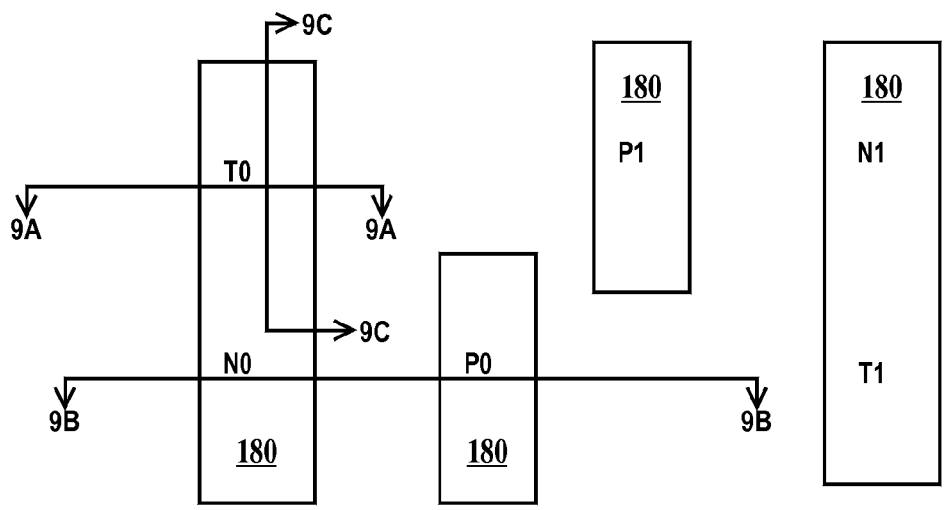
FIG. 8 is a top view and FIGS. 9A, 9B and 9C are section views through respective lines 9A-9A, 9B-9B and 9C-9C of FIG. 8 of an SRAM cell illustrating first steps of a set of steps for fabricating an SRAM cell according to embodiments of the present invention.
Figure 10:
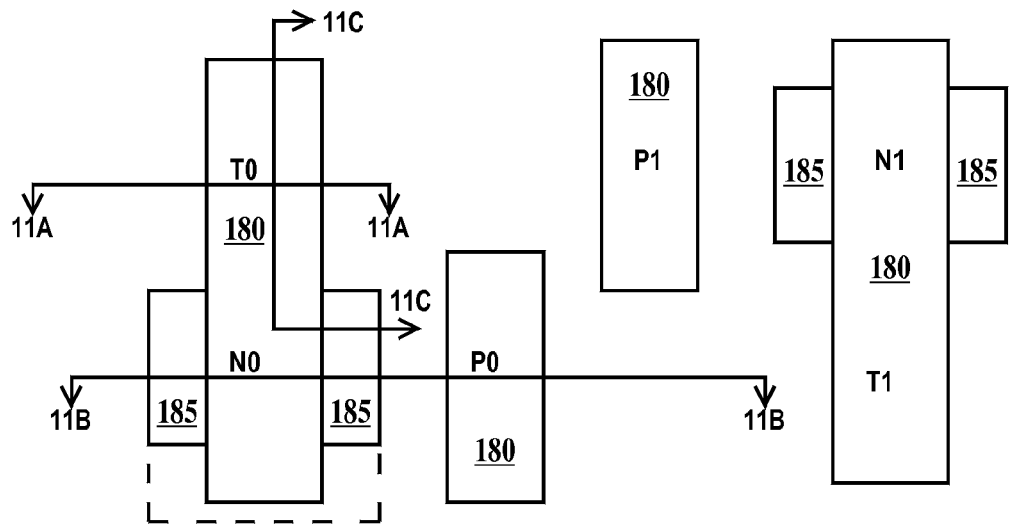
FIG. 10 is a top view and FIGS. 11A, 11B and 11C are section views through respective lines 11A-11A, 11B-11B and 11C-11C of FIG. 10 of an SRAM cell illustrating second steps of the set of steps for fabricating the SRAM cell according to embodiments of the present invention.
Figure 14:
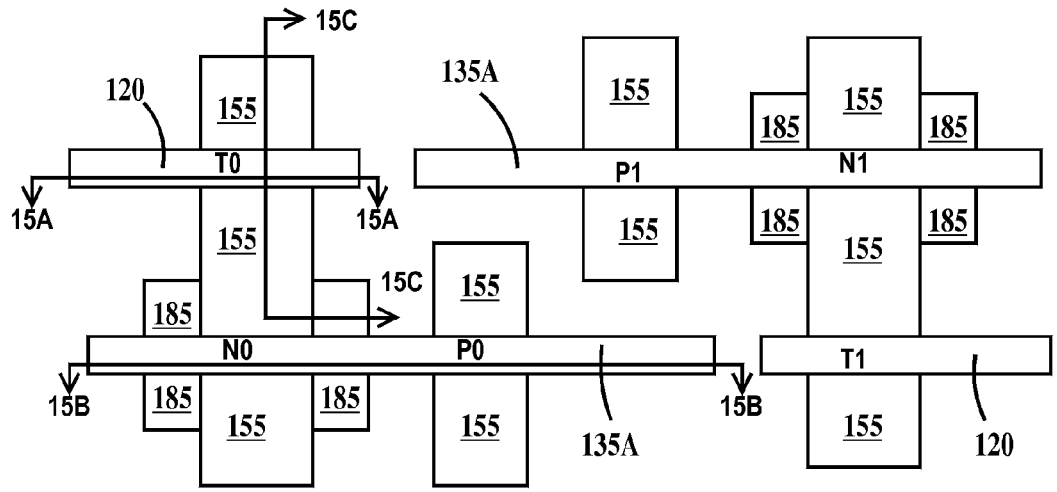
FIG. 14 is a top view and FIGS. 15A, 15B and 15C are section views through respective lines 15A-15A, 15B-15B and 15C-15C of FIG. 14 of an SRAM cell illustrating fourth steps of the set of steps for fabricating the SRAM cell according to embodiments of the present invention.

In FIGS. 8, 10, 12, 14, 16 and 18 and their respective cross-section FIGs., the fabrication steps of the SRAM cell of FIG. 3 are illustrated, but the method of fabrication is equally applicable to the fabrication of the SRAM cell of FIG. 4. In FIGS. 8, 10, 12, 14, 16 and 18 the locations of FETs T0 and T1, NFETs N0 and N1 and PFETs P0 and P1 are indicated to provide reference points. The photolithographic processes referenced infra include forming a photoresist layer on the substrate, patterning the photoresist layer by exposing the photoresist layer to actinic radiation through a patterned photomask, etching (e.g., by reactive ion etch (RIE) or other etch process) or ion implanting the substrate, and then removing the photoresist. The shapes illustrated in FIGS. 8, 10 and 14 are defined by photomasks. Other photomasks define larger regions of the substrate (e.g., for ion implantations in particular) rather than a physical shape of the SRAM cell. It is also possible to use patterned photoresist layers to define patterned hardmask layers as is well known in the art.

Figure 9A:
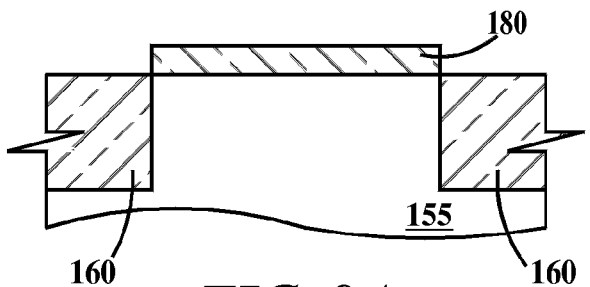
Figure 9C:
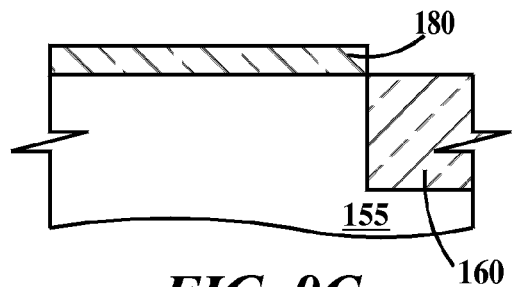
Figure 9B:
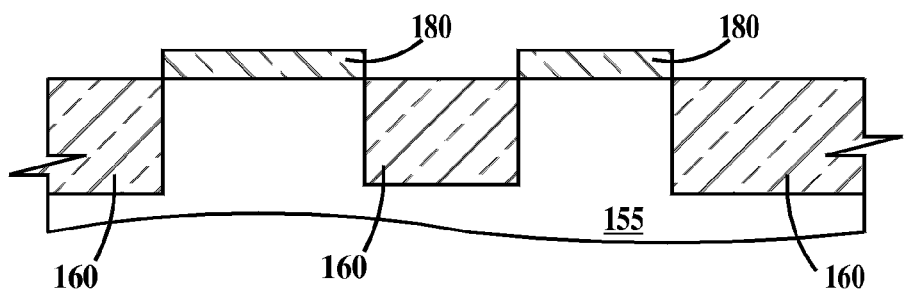

FIG. 8 is a top view and FIGS. 9A, 9B and 9C are section views through respective lines 9A-9A, 9B-9B and 9C-9C of FIG. 8 of an SRAM cell illustrating first steps of a set of steps for fabricating an SRAM cell according to embodiments of the present invention. In FIGS. 8, 9A, 9B and 9C, a dielectric pad layer 180 is formed and patterned (by a first photolithographic process) on substrate 155, and STI 160 formed in the substrate where the substrate is not protected by the pad layer. In one example, STI 160 is formed by etching trenches into substrate 155 where the substrate is not protected by pad layer 180, filling the trenches with a dielectric fill material (e.g., by deposition of silicon oxide) and performing a chemical-mechanical polish (CMP) to remove excess fill trenches material and expose a top surface of pad layer 180. Depending upon the CMP process variables, the relative position of the top surfaces of STI 160 and pad layer 180 can vary from that illustrated in FIGS. 9A, 9B and 9C, where the bottom surface of the pad layer is coplanar with the top surface of the STI to where the top surfaces of the pad layer and STI are coplanar.

Figure 11A:
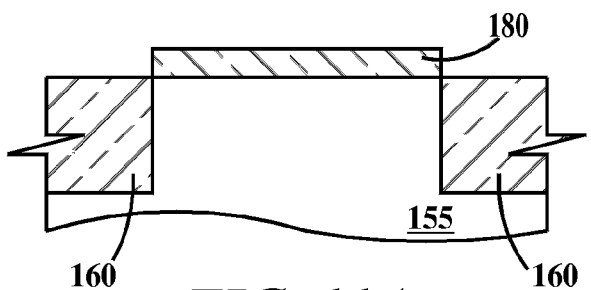
Figure 11C:
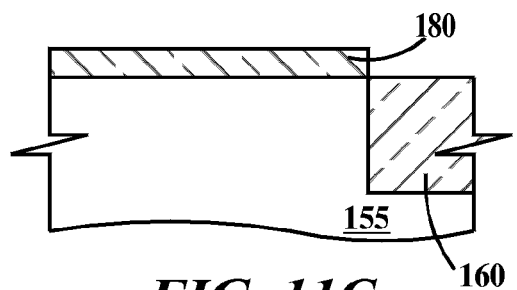
Figure 11B:
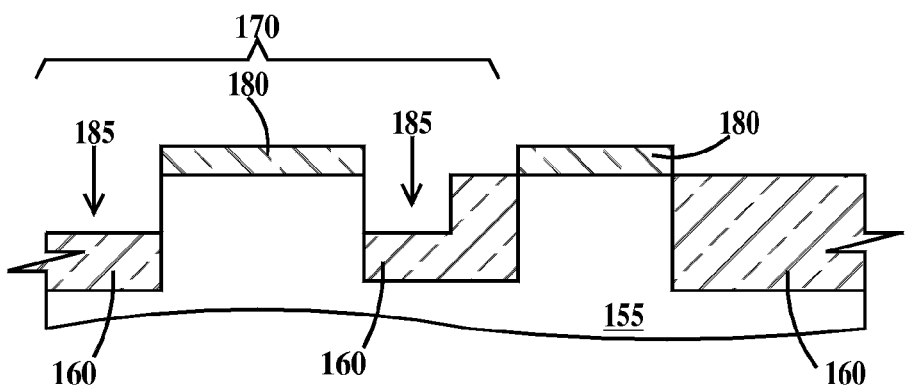

FIG. 10 is a top view and FIGS. 11A, 11B and 11C are section views through respective lines 11A-11A, 11B-11B and 11C-11C of FIG. 10 of an SRAM cell illustrating second steps of the set of steps for fabricating the SRAM cell according to embodiments of the present invention. In FIGS. 10, 11A, 11B and 11C, in a second photolithographic step, with pad layer 180 in place, recesses 185 are formed in region 170 where NFETs N0 (and N1) are to be formed to expose substrate 155 on one side of trenches 185 but not in the bottom of trenches 185. Alternatively, recesses 185 may be extended past the pad layer 180 in which NFET N0 is to be formed (as illustrated by the dashed lines) though this may increase the area of the SRAM cell. To fabricate the SRAM cell illustrated in FIGS. 4, 5A, 5B and 5C, the STI around PFET P0 (and P1) would be similarly recessed.

Figure 12:
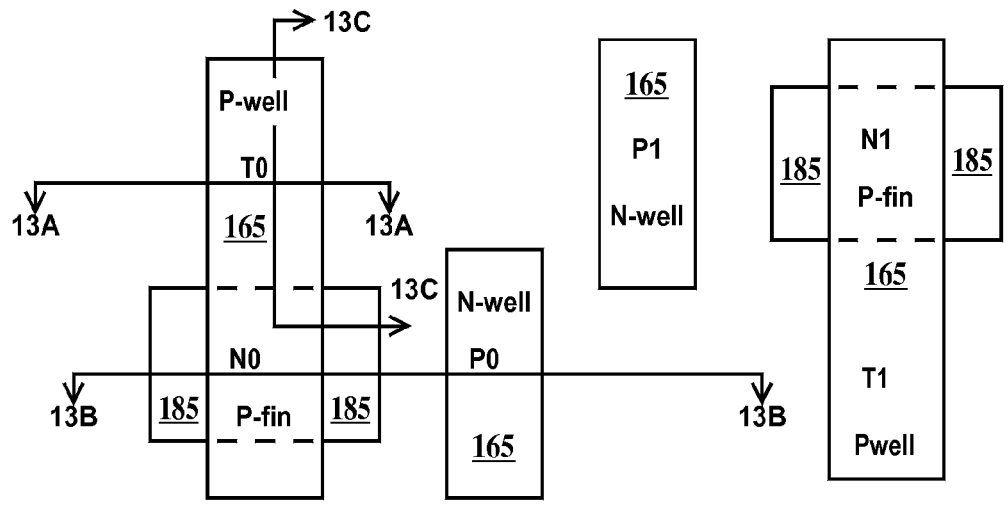
FIG. 12 is a top view and FIGS. 13A, 13B and 13C are section views through respective lines 13A-13A, 13B-13B and 13C-13C of FIG. 12 of an SRAM cell illustrating third steps of the set of steps for fabricating the SRAM cell according to embodiments of the present invention.
Figure 13A:
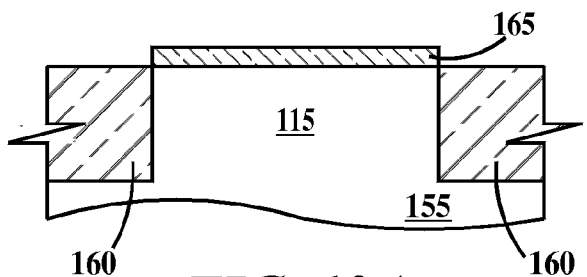
Figure 13C:
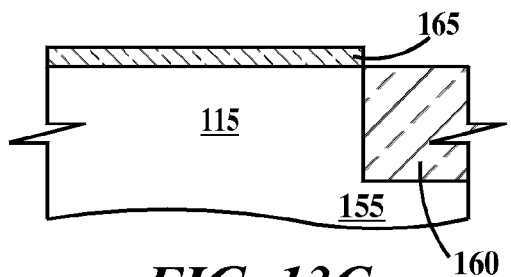
Figure 13B:
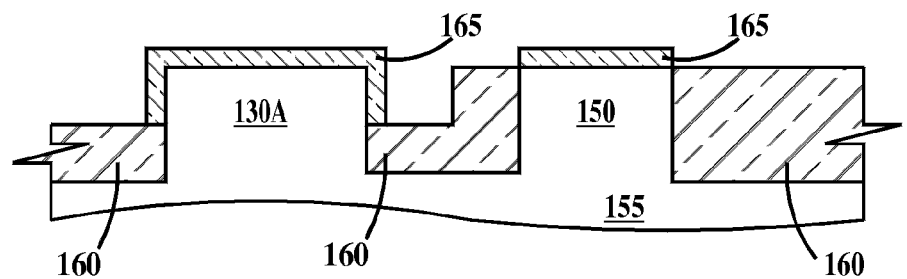

FIG. 12 is a top view and FIGS. 13A, 13B and 13C are section views through respective lines 13A-13A, 13B-13B and 13C-13C of FIG. 12 of an SRAM cell illustrating third steps of the set of steps for fabricating the SRAM cell according to embodiments of the present invention. In FIGS. 12, 13A, 13B and 13C, N-well and P-well ion implantations are performed in respective third and fourth photolithographic steps. P-wells (which define the doping level of channel region 115) of FETs T0 and T1, P-fins (which define the doping level of channel region 130A) of NFETs N0 and N1 (more precisely, FinNFETs N0 and N1) and N-wells (which define the doping level of PFETs P0 and P1) are thus formed. Alternatively, the ion implantation that defines the P-well and P-fin doping levels may be two separate ion-implantations, each having its own associated photolithographic step. After the ion implantations, the pad layer (see FIGS. 10, 11A, 11B and 11C) is removed and gate dielectric layer 165 formed. While all FETs are shown having the same gate dielectric layer 165, it is possible to form different gate dielectrics layers for FETs T0 and T1, NFETs N0 and N1, and PFETs P0 and P1. Gate dielectric layer 165 may be deposited or grown.

Figure 15A:
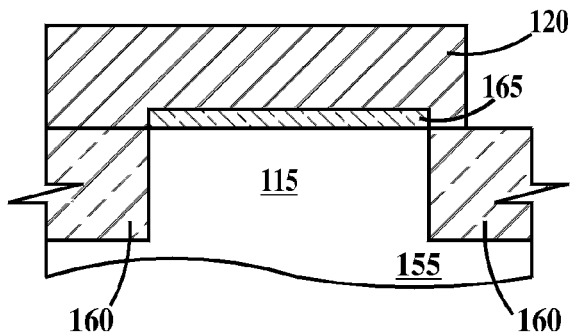
Figure 15C:
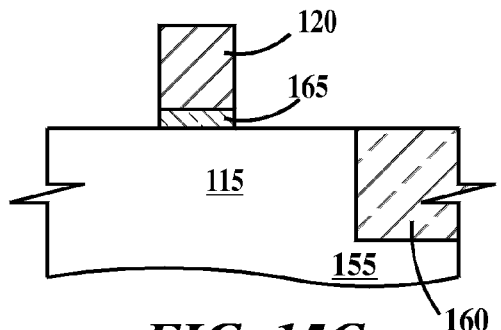
Figure 15B:
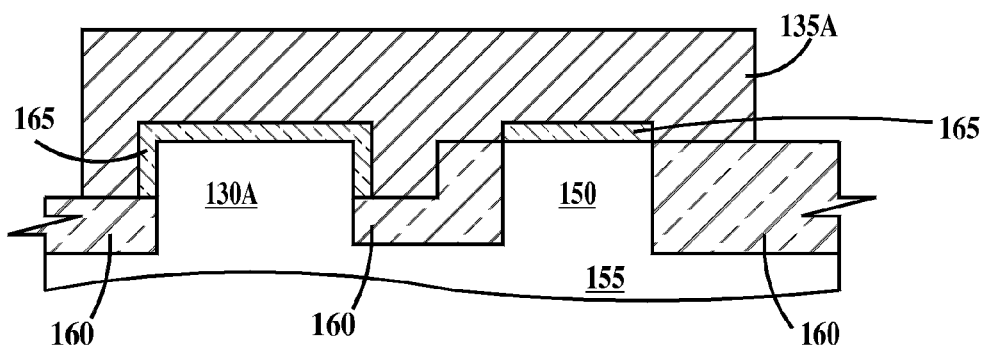

FIG. 14 is a top view and FIGS. 15A, 15B and 15C are section views through respective lines 15A-15A, 15B-15B and 15C-15C of FIG. 14 of an SRAM cell illustrating fourth steps of the set of steps for fabricating the SRAM cell according to embodiments of the present invention. In FIGS. 14, 15A, 15B and 15C, gates 120 and 135A are formed. In one example gates 120 and 135A are formed by depositing a layer of polysilicon and patterning the polysilicon in a sixth photolithographic step.

Figure 16:
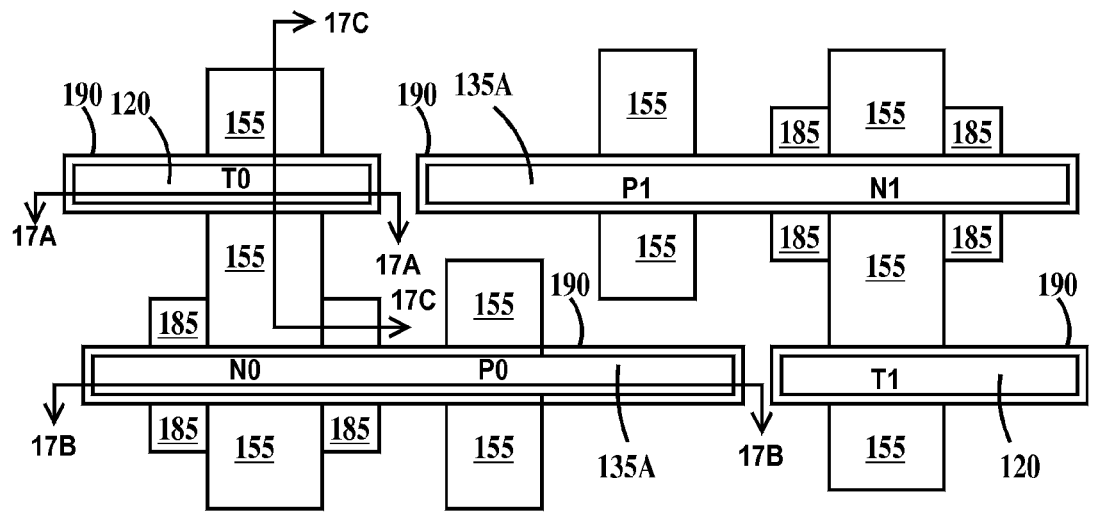
FIG. 16 is a top view and FIGS. 17A, 17B and 17C are section views through respective lines 17A-17A, 17B-17B and 17C-17C of FIG. 16 of an SRAM cell illustrating fifth steps of the set of steps for fabricating the SRAM cell according to embodiments of the present invention.
Figure 17A:
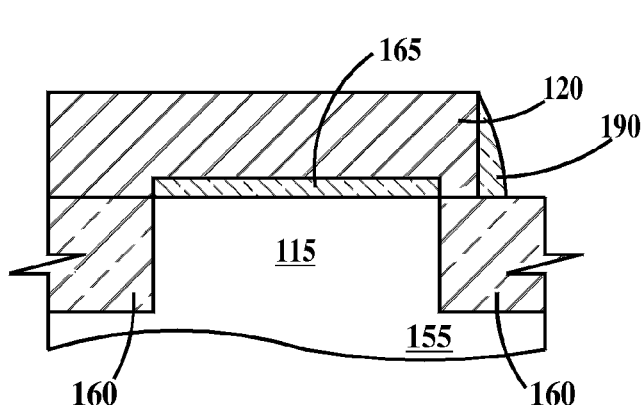
Figure 17C:
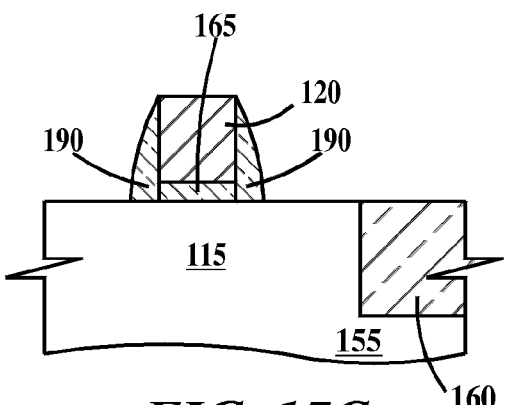
Figure 17B:
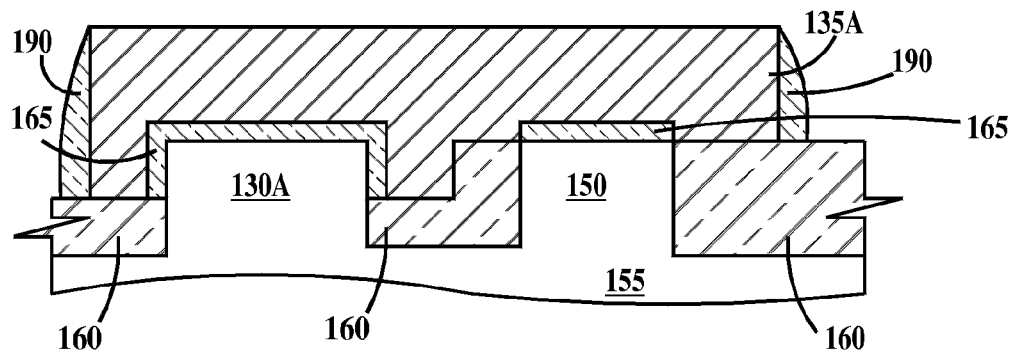

FIG. 16 is a top view and FIGS. 17A, 17B and 17C are section views through respective lines 17A-17A, 17B-17B and 17C-17C of FIG. 16 of an SRAM cell illustrating fifth steps of the set of steps for fabricating the SRAM cell according to embodiments of the present invention. In FIGS. 16, 17A, 17B and 17C, dielectric spacers 190 are formed on the sidewalls of gates 120 and 135A. In one example, spacers 190 are formed by depositing a conformal layer of dielectric (e.g., silicon nitride) and performing a direction etch (e.g., RIE) as is well known in the art. Spacers 190 may comprise multiple layers.

Figure 18:
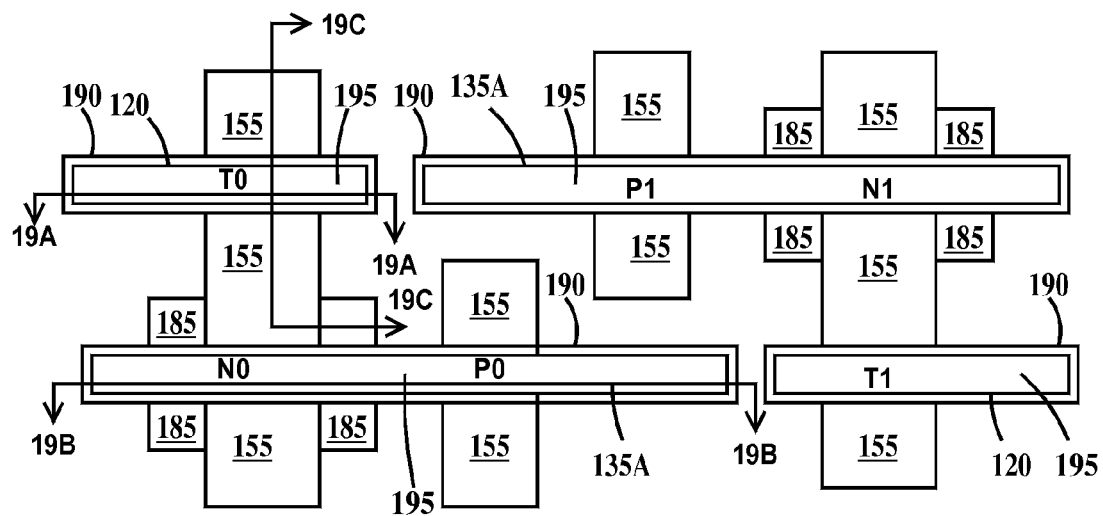
FIG. 18 is a top view and FIGS. 19A, 19B and 19C are section views through respective lines 19A-19A, 19B-19B and 19C-19C of FIG. 18 of an SRAM cell illustrating sixth steps of the set of steps for fabricating the SRAM cell according to embodiments of the present invention.
Figure 19A:
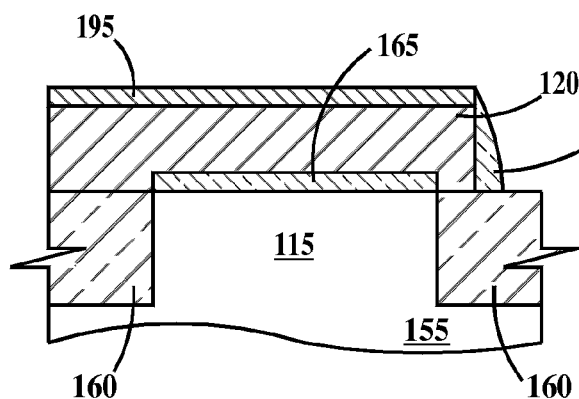
Figure 19C:
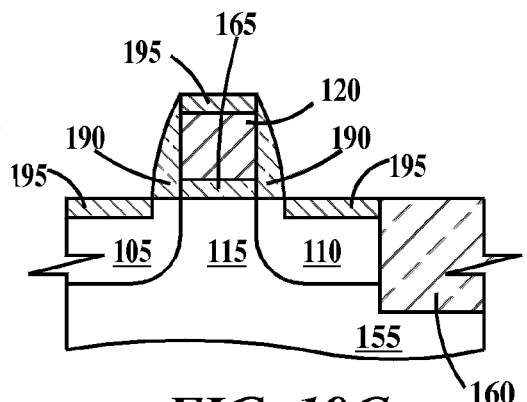
Figure 19B:
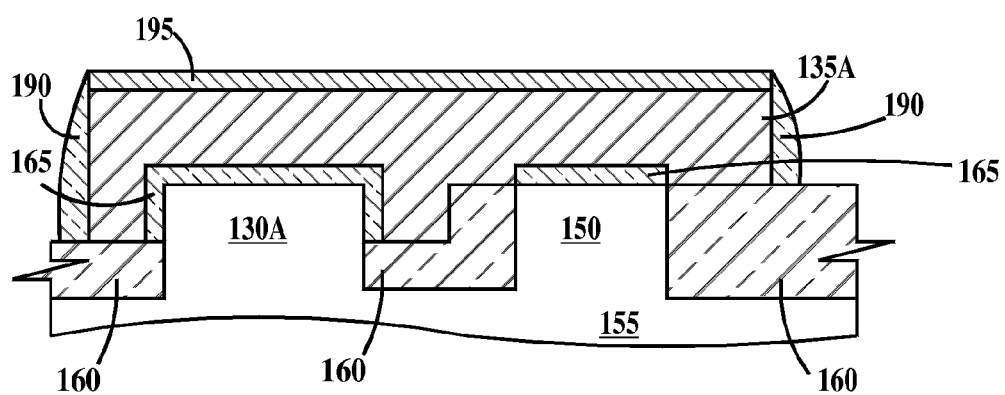

FIG. 18 is a top view and FIGS. 19A, 19B and 19C are section views through respective lines 19A-19A, 19B-19B and 19C-19C of FIG. 18 of an SRAM cell illustrating sixth steps of the set of steps for fabricating the SRAM cell according to embodiments of the present invention. In FIGS. 18, 19A, 19B and 19C, a seventh photolithographic process is performed to define the source and drains of FETs T0 and T1 and NFETs N0 and N1 and an eighth photolithographic process is performed to define the source and drains of PFETs P0 and P1. Alternatively, the source and drains of FETs T0 and T1 and NFETs N0 and N1 may be defined using separate photolithographic steps. Other implantations, such as halo implants and source/drain extensions implants may be performed at this time. It is possible to form several spacers on top of each other with ion implantations (and possibly additional photolithographic steps) between the spacer formations (e.g., form spacer, ion implant, form spacer, ion implant . . . etc).

After the ion implantations, a metal silicide layer 195 is formed on the top surfaces of gates 120 and 135A. In one example, metal silicide layer 195 is formed by blanket depositing a metal, such as Pt, Co, or Ni, heating to an elevated temperature (e.g., above about 500° C.) to cause a reaction between the metal and silicon forming a metal silicide and then removing the unreacted metal. The metal does not react with the silicon atoms of $SiO_2$ or $Si_3N_4$.

The SRAM cell is completed by forming a dielectric layer, forming electrically conductive contacts through the dielectric layer to FETs T0 and T1, NFETs N0 and N1, and PFETs P0 and P1. Then additional wiring (to complete the SRAM cell circuit) is formed in next deposited interlevel dielectric layers, the wires electrically contacting the conductive contacts.

Thus the embodiments of the present invention provide SRAM circuits, SRAM physical designs and method of fabricating SRAM circuits having reduced chip area.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:
1. A circuit, comprising:
a first inverter comprising a first PFET and a first NFET, a source of said first PFET coupled to a first terminal of a power supply, a source of said first NFET coupled to a second terminal of said power supply, drains of said first

PFET and said first NFET connected to a first storage node, gates of said first PFET and said first NFET connected to a second storage node, said first NFET being a FinFET;

a second inverter comprising a second PFET and a second NFET, a source of said second PFET coupled to said first terminal of said power supply, a source of said second NFET coupled to said second terminal of said power supply, drains of said second PFET and said second NFET connected to said second storage node, gates of said second PFET and second NFET connected to said first storage node, said second NFET being a FinFET;

a first FET connected between said first storage node and a first bitline, a gate of said first FET connected to a wordline, said first FET being a planar FET; and a second FET connected between said second storage node and a second bitline, a gate of said second FET connected to said wordline, said second FET being a planar FET.

2. The circuit of claim 1 wherein said first and second NFETs have a first gate width, said first and second PFETs have a second gate width, said first and second FETs have a third gate width, said first gate width greater than said second gate width, said first gate width greater than said third gate width.

3. The circuit of claim 1, wherein said first and second PFETs are FinFETs.

4. The circuit of claim 1, wherein said first and second PFETs are planar FETs.

5. The circuit of claim 1, wherein first and second FETs are NFETs.

6. The circuit of claim 5, wherein:

said first FET is formed in a first end of a rectangular first region of a semiconductor layer and said first NFET formed in an opposite second end of said first region, said drains of said first FET and said first NFET abutting, said source of said first FET abutting said first end of said first region, said source of said first NFET abutting said second end of said first region; and said second FET is formed in a first end of a rectangular second region of said semiconductor layer and said second NFET formed in an opposite second end of said second region, said drains of said second FET and said second NFET abutting, said source of said second FET abutting said first end of said second region, said source of said second NFET abutting said second end of said second region.

7. The circuit of claim 1, wherein:

a ratio of drive current capability of said first NFET to a drive current capability of said first FET is greater than N;

a ratio of drive current capability of said second NFET to a drive current capability of said second FET is greater than N; and N is equal to or greater than about 1.0.

8. A structure, comprising:

a rectangular first region of a semiconductor layer having first and second opposite ends connected by first and second opposite sidewalls, a source of a first NFET abutting said first end of said first region, a source of a second NFET abutting said second end of said first region, a first common drain region of said first and second NFETs between said first and second ends of said first region, a channel region of said first NFET between said source of said first NFET and said first common drain region, a channel region of said second NFET between said source of said second NFET and said first common drain region, a first gate dielectric layer between said top surface of said channel region of said first NFET and a first gate electrode, said first dielectric layer not extending over said first and second sidewalls of said first region in said channel region of said first NFET, a second gate dielectric layer between (i) a top surface and said first and second sidewalls of said first region in said channel region of said second NFET and (ii) a second gate electrode; and a second region of said semiconductor layer having first and second opposite ends connected by first and second opposite sidewalls, a drain of a first PFET abutting said first end of said second region, a source of said first PFET abutting said second end of said second region, a channel region of said first PFET between said source and said drain of said first PFET, a third dielectric layer between said second gate electrode and a top surface of said channel region of said first PFET.

9. The structure of claim 8, wherein said third dielectric layer extends onto said first and second sidewalls of said second region in said channel region of said first PFET and said second gate electrode extends onto said third dielectric layer where said third dielectric layer extends onto said first and second sidewalls of said second region.

10. The structure of claim 8 further including:

dielectric isolation abutting said first and second ends and said first and second sidewalls of said first region and abutting said first and second ends and said first and second sidewalls of said second region; and a first area of said dielectric isolation abutting regions of said first and second sidewalls proximate to said second end of said first region recessed below a second area of said dielectric isolation proximate to said first end and to regions of said first and second sidewalls adjacent to said first end of said first region.

11. The structure of claim 8, further comprising:

a rectangular third region of said semiconductor layer having first and second opposite ends connected by first and second opposite sidewalls, a source of a third NFET and abutting said first end of said third region, a source of a fourth NFET abutting said second end of said third region, a second common drain region of said third and fourth NFETs between said first and second ends of said third region, a channel region of said third NFET between said source of said third NFET and said second common drain region, a channel region of said fourth NFET between said source of said third NFET and said second common drain region, a fourth gate dielectric layer between a top surface of said channel region of said third NFET and a third gate electrode, said fourth dielectric layer not extending over said first and second sidewalls of said third region in said channel region of said third NFET, a fifth gate dielectric layer between (i) a top surface and said first and second sidewalls of said third region in said channel region of said fourth NFET and (ii) a fourth gate electrode; and a fourth region of said semiconductor layer having first and second opposite ends and first connected by second opposite sidewalls, a drain of a second PFET abutting said first end of said fourth region, a source of said second PFET abutting said second end of said fourth region, a channel region of said second PFET between said source and said drain of said second PFET, a sixth dielectric layer between (i) a top surface and said first and second sidewalls of said fourth region in said channel region of said second PFET and (ii) said third gate electrode.

12. The structure of claim 11, wherein said sixth dielectric layer extends onto said first and second sidewalls of said fourth region in said channel region of said second PFET and said fourth gate electrode extends onto said sixth dielectric layer where said sixth dielectric layer extends onto said first and second sidewalls of said fourth region.

13. The structure of claim 11 further including:
dielectric isolation abutting said first and second ends and said first and second sidewalls of said first region, abutting said first and second ends and said first and second sidewalls of said second region, abutting said first and second ends and said first and second sidewalls of said third region, and abutting said first and second ends and said first and second sidewalls of said fourth region;
a first area of said dielectric isolation abutting regions of said first and second sidewalls proximate to said second end of said first region recessed below a second area of said dielectric isolation proximate to said first end and to regions of said first and second sidewalls adjacent to said first end of said first region;
a third area of said dielectric isolation abutting regions of said first and second sidewalls proximate to said second end of said third region recessed below a fourth area of said dielectric isolation proximate to said first end and to regions of said first and second sidewalls adjacent to said first end of said third region; and
said first and third areas coplanar and said second and fourth areas coplanar.

14. The structure of claim 11, further including:
an electrically conductive first wire between said drain of said first PFET and said fourth gate electrode; and
an electrically conductive second wire between said drain of said second PFET and said second gate electrode.

15. A method, comprising:
(a) forming a pad layer on a top surface of a semiconductor layer;
after (a), (b) removing regions of said pad layer to form a patterned pad layer;
after (b), (c) forming trenches in said substrate where said substrate is not protected by said patterned pad layer;
after (c), (d) filling said trenches with a dielectric material to form rectangular first, second, third and fourth regions of said semiconductor layer, each of said first, second, third and fourth regions having respective opposite first and second ends and opposite first and second sidewalls connecting said first and second ends;
after (d), (e) recessing a first area of said dielectric isolation abutting regions of said first and second sidewalls proximate to said second end of said first region below a top surface of said dielectric isolation, recessing a second area of said dielectric isolation abutting regions of said first and second sidewalls proximate to said second end of said third region below said top surface of said dielectric isolation, said first and second areas of said dielectric isolation coplanar;
after (e), (f) removing any remaining portions of said pad layer and forming a gate dielectric layer on all exposed surfaces of said semiconductor substrate;
after (f), (g) forming a polysilicon layer on said gate dielectric layer and all exposed surfaces of said dielectric isolation;
after (g), (h) patterning said polysilicon layer to form a first gate electrode extending over said first region, a second gate electrode extending over said first and second regions, a third gate electrode extending over said third region, a fourth gate electrode extending over said third and fourth regions;
after (h), (i) ion implanting an N-type first dopant species into said first and third regions to form a source of a first NFET abutting said first end of said first region, a source of a second NFET abutting said second end of said first region, a first common drain region of said first and second NFETs between said first and second gate electrodes, a source of a third NFET abutting said first end of said third region, a source of a fourth NFET abutting said second end of said third region, a second common drain region of said third and fourth NFETs between said third and fourth gate electrodes; and
after (i), (j) ion implanting a P-type second dopant species into said second and fourth regions to form, a drain of a first PFET abutting said first end of said second region, a source of said first PFET abutting said second end of said second region, a channel region of said first PFET between said source and said drain of said first PFET and under said second gate electrode, a drain of a second PFET abutting said first end of said fourth region, a source of said second PFET abutting said second end of said fourth region, a channel region of said second PFET between said source and said drain of said second PFET and under said fourth gate electrode.

16. The method of claim 15, (e) further including:
recessing a third area of said dielectric isolation abutting said first and second ends and said first and second sidewalls of said second region below said top surface of said dielectric isolation, recessing a fourth area of said dielectric isolation abutting said first and second ends and said first and second sidewalls of said fourth region below said top surface of said dielectric isolation, said first, second, third and fourth areas of said dielectric isolation coplanar.

17. The method of claim 16, further comprising, between (d) and (e):
ion implanting a P-type third dopant species into said first and third regions; and
ion implanting a N-type fourth dopant species into said second and fourth regions.

18. The method of claim 16, further comprising, between (h) and (i):
forming dielectric spacers on all sidewalls of all said first, second, third and fourth gate electrodes; and
removing said gate dielectric layer where said gate dielectric layer is not protected by said spacers or said first, second, third and fourth gate electrodes.

19. The method of claim 15, further comprising, between (d) and (e):
ion implanting a P-type third dopant species into said first and second regions; and
ion implanting a fourth N-type dopant species into said third and fourth regions.

20. The method of claim 15, further comprising, between (h) and (i):
forming dielectric spacers on all sidewalls of all said first, second, third and fourth gate electrodes; and
removing said gate dielectric layer where said gate dielectric layer is not protected by said spacers or said first, second, third and fourth gate electrodes.

* * * * *